US010600726B2

(12) United States Patent
Huang

(10) Patent No.: US 10,600,726 B2
(45) Date of Patent: Mar. 24, 2020

(54) LEADFRAME AND METHOD OF MAKING THE SAME

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/203,683

(22) Filed: Nov. 29, 2018

(65) Prior Publication Data

US 2020/0027822 A1    Jan. 23, 2020

(30) Foreign Application Priority Data

Jul. 23, 2018 (TW) .............................. 107125357 A

(51) Int. Cl.
*H01L 23/495* (2006.01)
*H01L 21/48* (2006.01)

(52) U.S. Cl.
CPC .... *H01L 23/49503* (2013.01); *H01L 21/4842* (2013.01); *H01L 23/49548* (2013.01)

(58) Field of Classification Search
CPC ........... H01L 23/49503; H01L 21/4842; H01L 23/49578
See application file for complete search history.

(56) References Cited

U.S. PATENT DOCUMENTS

| | | | | |
|---|---|---|---|---|
| 3,152,033 A | * | 10/1964 | Black | F16L 59/065 428/138 |
| 5,100,498 A | * | 3/1992 | Takeuchi | B41J 2/395 216/100 |
| 5,230,144 A | * | 7/1993 | Ootsuki | H01L 21/4842 29/827 |
| 5,271,148 A | * | 12/1993 | Desrochers | H01L 21/4842 257/E23.043 |
| 5,378,656 A | * | 1/1995 | Kajihara | H01L 21/4842 29/827 |
| 5,422,314 A | * | 6/1995 | Sekiba | H01L 21/4842 257/E23.046 |
| 5,587,606 A | * | 12/1996 | Sekiba | H01L 21/4842 257/666 |
| 6,429,050 B1 | * | 8/2002 | Fritzsche | H01L 21/4828 257/666 |
| 6,724,070 B2 | * | 4/2004 | Fritzsche | H01L 21/4828 257/666 |
| 7,105,378 B2 | * | 9/2006 | Ng | H01L 21/4842 257/670 |
| 9,704,725 B1 | * | 7/2017 | Kim | H01L 21/4842 |

(Continued)

*Primary Examiner* — Earl N Taylor
(74) *Attorney, Agent, or Firm* — Burris Law, PLLC

(57) ABSTRACT

A leadframe includes first and second surfaces, a plurality of leads, and a hole-defining wall unit including a plurality of first-hole defining walls each defining a first through hole and a plurality of second-hole defining walls each defining a second through hole. Each of the first and second through holes is formed between two adjacent ones of the leads. Each of the first hole-defining walls has top and bottom edges respectively forming arcuate and burr regions with the first and surfaces at junctions therebetween. Each of the second hole-defining walls has top and bottom edges respectively forming burr and arcuate regions with the first and second surfaces at junctions therebetween.

16 Claims, 11 Drawing Sheets

(56) References Cited

U.S. PATENT DOCUMENTS

| | | | |
|---|---|---|---|
| 2005/0179118 A1* | 8/2005 | Ng | H01L 21/4842 |
| | | | 257/666 |
| 2013/0249071 A1* | 9/2013 | Yao | H01L 21/561 |
| | | | 257/676 |
| 2016/0005626 A1* | 1/2016 | van Gernert | H01L 21/4825 |
| | | | 257/676 |
| 2017/0271249 A1* | 9/2017 | Kasuya | H01L 21/4853 |
| 2018/0236696 A1* | 8/2018 | Kaneko | H01L 23/49534 |

* cited by examiner

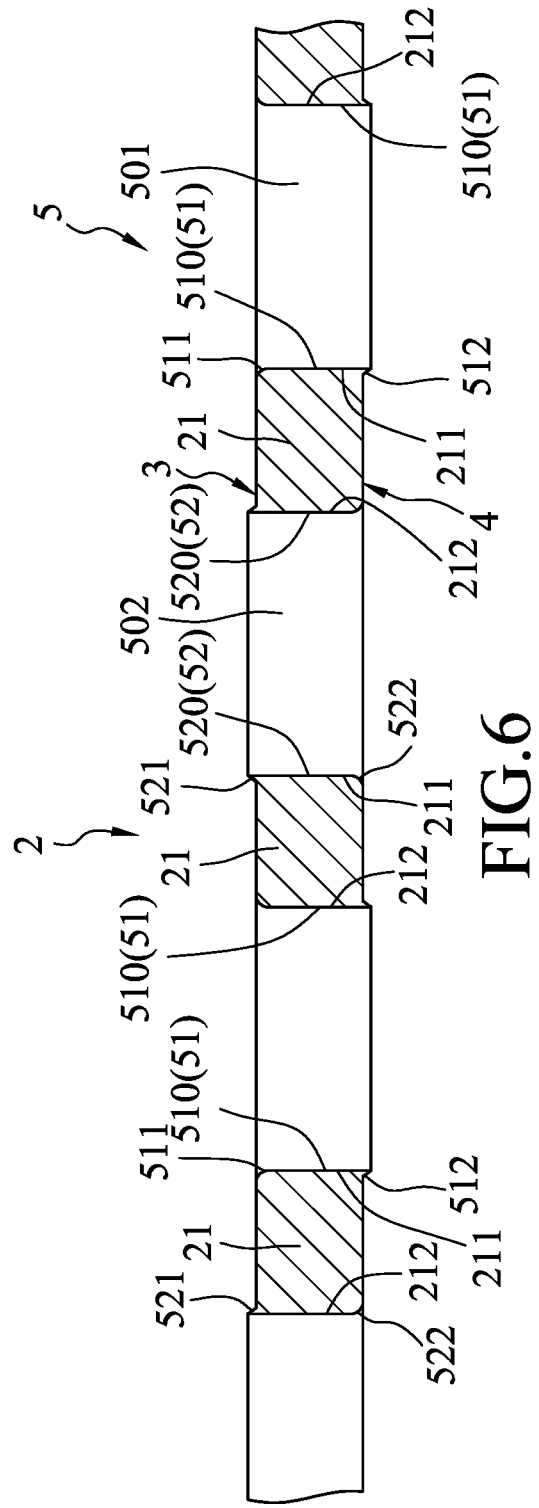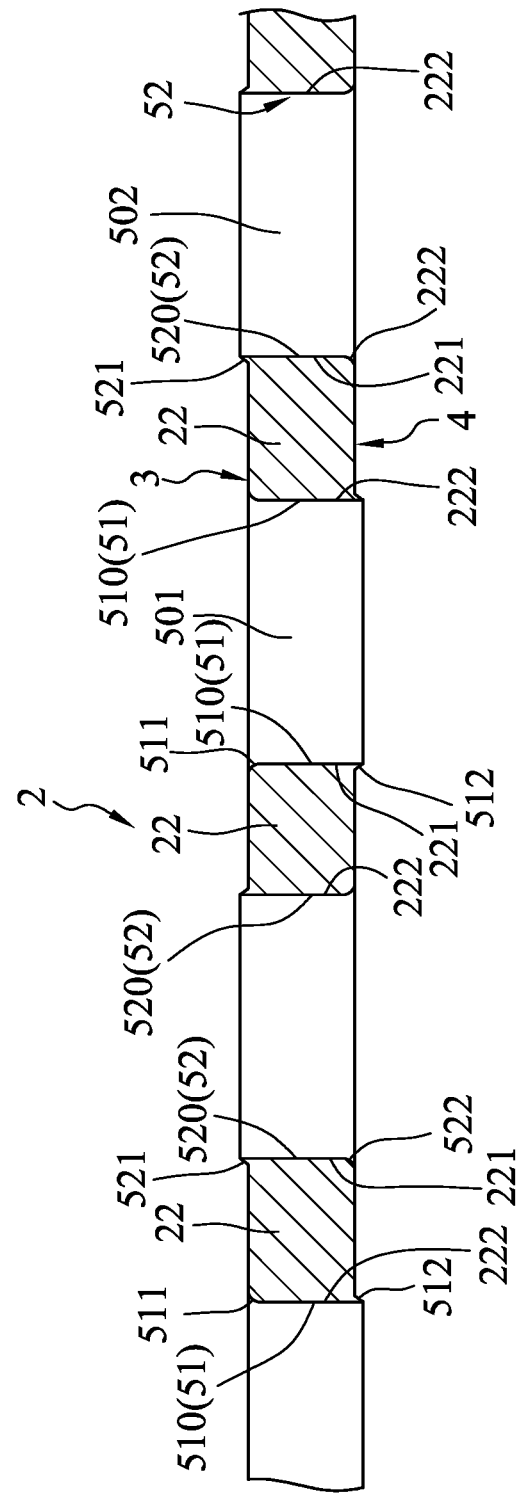

LEADFRAME AND METHOD OF MAKING THE SAME

CROSS-REFERENCE TO RELATED APPLICATION

This application claims priority to Taiwanese Invention Patent Application No. 107125357, filed on Jul. 23, 2018.

FIELD

The disclosure relates to a leadframe, and more particularly to a leadframe having a structure configured for even distribution of stress and a method of making the leadframe.

BACKGROUND

Referring to FIG. 1, a conventional leadframe 8 applicable to integrated chip (IC) packaging includes a first surface 81, a second surface 82 opposite to the first surface 82, a sheet-like die pad (not shown), a plurality of leads 83 that are disposed around the die pad, and a plurality of through holes 84 that extend from the first surface 81 to the second surface 82 and that are disposed among the die pad and the leads 83.

Each of the leads 83 has opposite lead top and bottom surfaces 831, 832. The first surface 81 of the leadframe 8 is defined by the lead top surfaces 831 of the leads 83 and a pad top surface of the die pad, and the second surface 82 of the leadframe 8 is defined by the lead bottom surfaces 832 of the leads 83 and a pad bottom surface of the die pad that is opposite to the pad top surface. The die pad is for disposition of an IC thereon, and the leads 83 are electrically connected to the IC with gold wires using wire-bonding techniques.

Further referring to FIG. 2, the conventional leadframe 8 is made by punching a substrate 80 with a punching machine 9. The substrate 80 has first and second sides defining the first and second surfaces 81, 82 of the leadframe 8, respectively. The punching machine 9 includes a lower mold 91 formed with a cavity 911, and an upper punch 92 movably disposed over the lower mold 91. The punching of the substrate 80 is conducted by passing the substrate 80 through the punching machine 9 with the first side facing the upper punch 92, and punching the substrate 80 in a punching direction from the first side to the second side to form the leads 83 and the through holes 84 so as to obtain the structure of the leadframe 8 as mentioned above. Each of the through holes 84 has a top opening opened at the first surface 81 and surrounded by an arcuate edge 811 connected to the first surface 81, and a bottom opening opened at the second surface 82 and surrounded by a burr edge 821 protruding from the second surface 82.

However, since all of the through holes 84 are formed by punching the substrate 80 in the same punching direction, the leadframe 8 thus formed is often deformed due to stress accumulated therein, which results in an undesired bend in the leadframe 8 as shown in FIG. 3.

SUMMARY

Therefore, an object of the disclosure is to provide a leadframe that can alleviate at least one of the drawbacks of the prior art.

According one aspect to the disclosure, a leadframe includes a first surface, a second surface opposite to the first surface, a lead unit, and a hole-defining wall unit.

The lead unit includes a plurality of leads each having a lead top surface and a lead bottom surface opposite to the top surface. The lead top surfaces of the leads cooperatively define the first surface, and the lead bottom surfaces cooperatively define the second surface.

The hole-defining wall unit includes a plurality of first-hole defining wall groups each having at least one first-hole defining wall and a plurality of second-hole defining wall groups each having at least one second-hone defining wall. Each of the first hole-defining walls extends from the first surface to the second surface and surroundingly defines a first through hole. Each of the second hole-defining walls extends from the first surface to the second surface and surroundingly defines a second through hole.

The first and second hole-defining wall groups are alternately disposed in the lead unit. Each of the first through holes defined by the first-hole defining walls of the first hole-defining wall groups and the second through holes defined by second-hole defining walls of the second hole-defining wall groups is formed between two adjacent ones of the leads.

The at least one first hole-defining wall of each of the first hole-defining wall groups has a first top edge connected to the first surface and a first bottom edge opposite to the first top edge and connected to the second surface. The first top edge and the first surface cooperatively form an arcuate region at a first junction therebetween. The first bottom edge and the second surface cooperatively form a burr region at a second junction therebetween, the burr region protruding from the second surface.

The at least one second hole-defining wall of each of the second hole-defining wall groups has a second top edge connected to the first surface and a second bottom edge opposite to the second top edge and connected to the second surface. The second top edge and the first surface cooperatively form a burr region at a third junction therebetween, the burr region protruding from the first surface. The second bottom edge and the second surface cooperatively form an arcuate region at a fourth junction therebetween.

According another aspect to the disclosure, a method of making a leadframe includes: providing a substrate having an upper surface and a bottom surface opposite to the upper surface, the upper and bottom surfaces of the substrate being configured to serve as first and second surfaces of the leadframe; punching the substrate in a first direction from the upper surface to the bottom surface so as to form a portion of a lead unit including a plurality of leads; and punching the substrate in a second direction from the bottom surface to the upper surface so as to form a remainder of the leas unit.

BRIEF DESCRIPTION OF THE DRAWINGS

Other features and advantages of the disclosure will become apparent in the following detailed description of the embodiments with reference to the accompanying drawings, of which:

FIG. 6 is a fragmentary cross-sectional view taken along line VI-VI of FIG. 5;

FIG. 7 is a fragmentary cross-sectional view taken along line VII-VII of FIG. 5;

DETAILED DESCRIPTION

Figure 1:
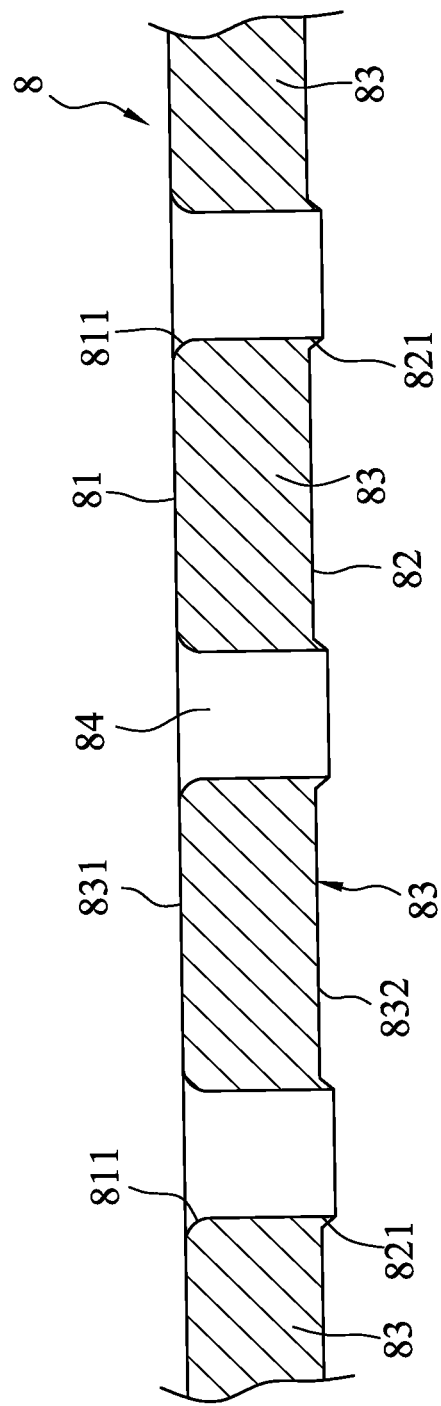
FIG. 1 is a fragmentary cross-sectional view illustrating a conventional leadframe.
Figure 2:
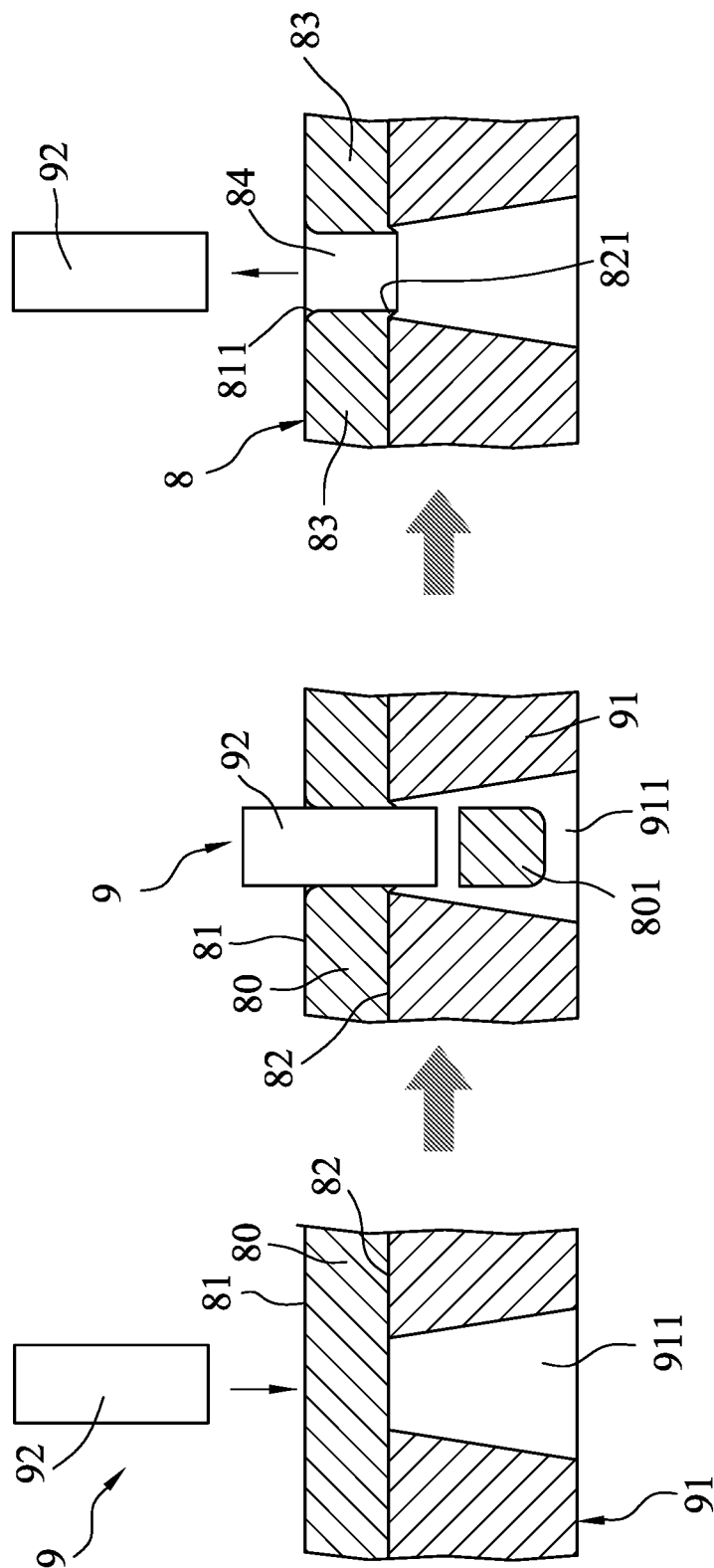
FIG. 2 is a fragmentary schematic view illustrating consecutive steps of a method of making the conventional leadframe.
Figure 3:
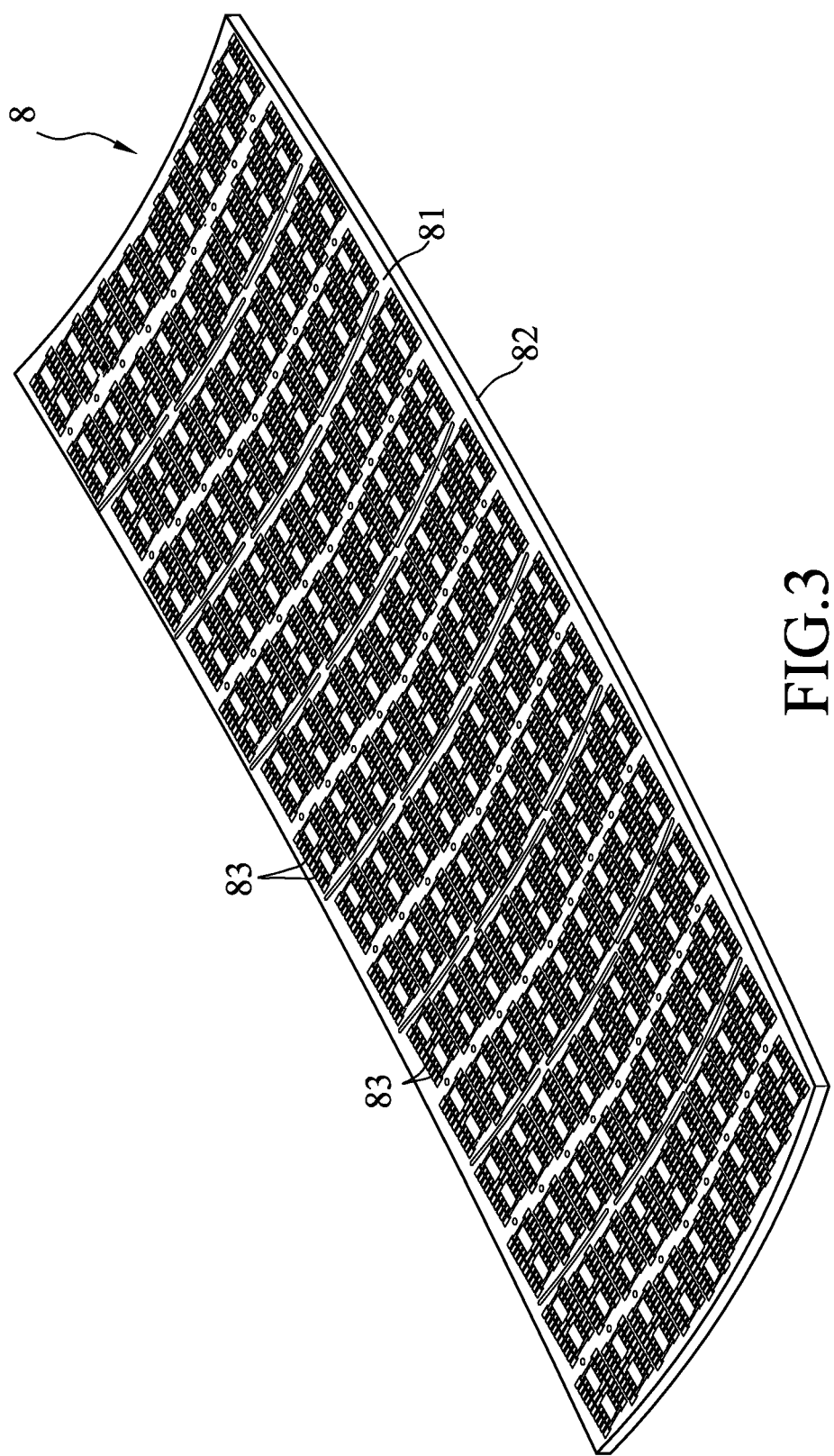
FIG. 3 is a perspective view illustrating a bend in the conventional leadframe.
Figure 4:
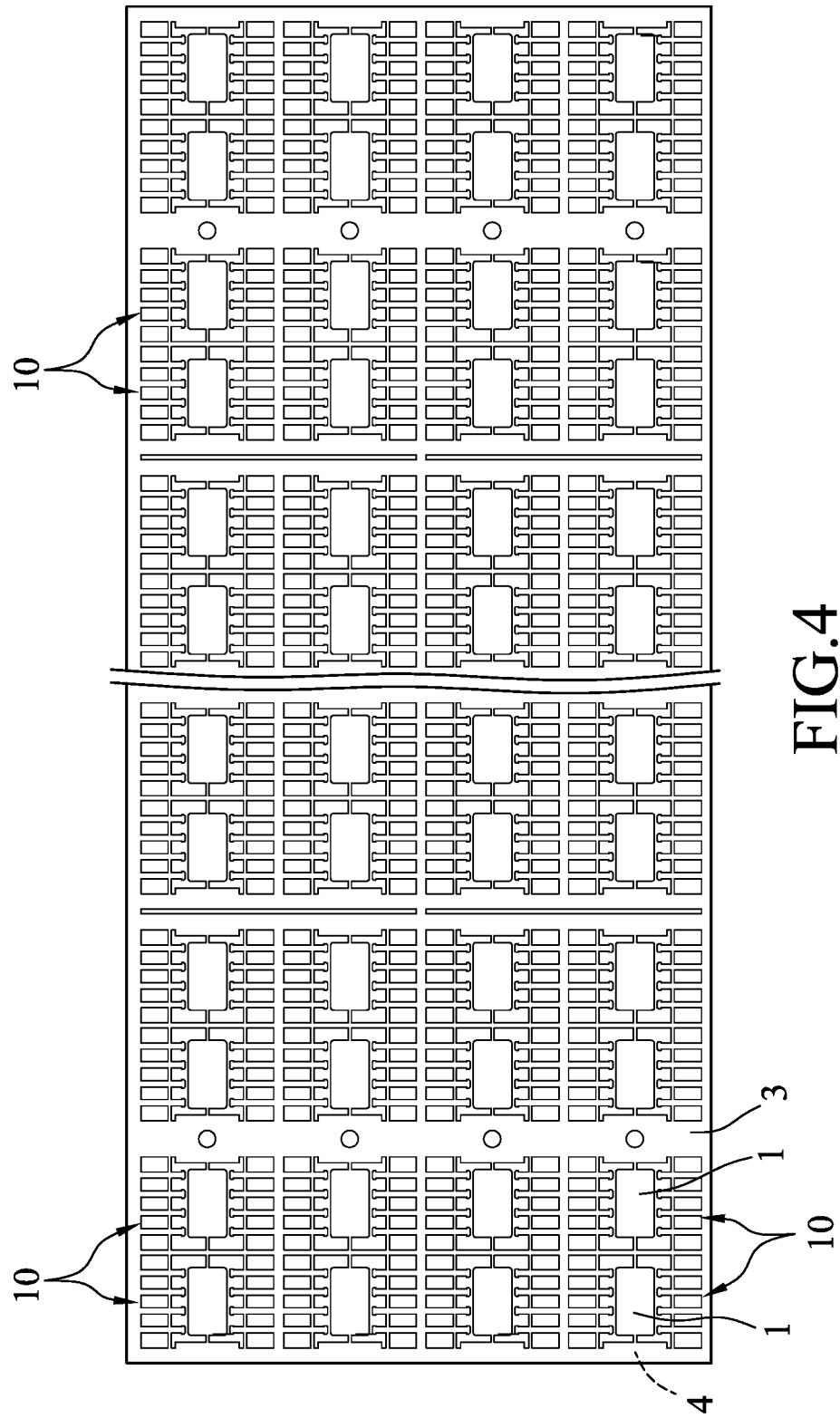
FIG. 4 is a top view illustrating an embodiment of a leadframe according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 4 to 7, an embodiment of a leadframe 10 according to the disclosure is illustrated. The leadframe 10 is adapted for integrated chip (IC) packaging and may be made of a metal sheet. The leadframe 10 includes a first surface 3, a second surface 4 opposite to the first surface 3, a die pad 1 adapted for mounting an integrated chip (IC), a lead unit 2, and a hole-defining wall unit 5.

The die pad 1 has a top surface and a bottom surface opposite to the top surface. The lead unit 2 includes a plurality of leads 20 surrounding the die pad 1. Each of the leads 20 has a lead top surface 213 and a lead bottom surface 214 opposite to the lead top surface 213. The lead top surfaces 213 of the leads 20 and the top surface of the die pad 1 cooperatively define the first surface 3 of the leadframe 10, and the lead bottom surfaces 214 and the bottom surface of the die pad 1 cooperatively define the second surface 4 of the leadframe 10.

The hole-defining wall unit 5 includes a plurality of first-hole defining wall groups 51 each having at least one first-hole defining wall 510, and a plurality of second-hole defining wall groups 52 each having at least one second-hole defining wall 520. Each of the first hole-defining walls 510 extends from the first surface 3 to the second surface 4 and surroundingly defines a first through hole 501. Each of the second hole-defining walls 520 extends from the first surface 3 to the second surface 4 and surroundingly defines a second through hole 502.

The first and second hole-defining wall groups 51, 52 are alternately disposed in the lead unit 2. Each of the first through holes 501 defined by the first hole-defining wall groups 51 and the second through holes 502 defined by the second hole-defining wall groups 52 is formed between two adjacent ones of the leads 20.

In this embodiment, each of the first-hole defining wall groups 51 is exemplified to include one first-hole defining wall 510 and each of the second-hole defining wall groups 52 is exemplified to include one second-hole defining wall 520.

The first hole-defining wall 510 of each of the first hole-defining wall groups 51 has a first top edge 511 connected to the first surface 3 and a first bottom edge 512 opposite to the first top edge 511 and connected to the second surface 4. The first top edge 511 and the first surface 3 cooperatively form an arcuate region at a first junction therebetween. The first bottom edge 512 and the second surface 4 cooperatively form a burr region at a second junction therebetween. The burr region protrudes from the second surface 4.

The second hole-defining wall 520 of each of the second hole-defining wall groups 52 has a second top edge 521 connected to the first surface 3 and a second bottom edge 522 opposite to the second top edge 521 and connected to the second surface 4. The second top edge 521 and the first surface 3 cooperatively form a burr region at a third junction therebetween. The burr region protrudes from the first surface 3. The second bottom edge 522 and the second surface 4 cooperatively form an arcuate region at a fourth junction therebetween.

In this embodiment, when the IC to be packaged is disposed on the die pad 1 of the leadframe 10, the lead unit 2 is electrically connected to the IC using the wire bonding techniques. In one form, the die pad 1 may be omitted from the leadframe 10 of the disclosure, in which case the leadframe 10 is also known as a lead on chip (LOC) leadframe.

Each of the leads 20 of the lead unit 2 has an inner lead portion 21 that has a first side surface 211 connected between the lead top surface 213 and the lead bottom surface 214, and a second side surface 212 opposite to the first side surface 211 and connected between the lead top surface 213 and the lead bottom surface 214.

The inner lead portion 21 of each of the leads 20 has a connecting end 215 and an enlarged free end 216 opposite to the connecting end 215 and proximal to the die pad 1. Each of the first side surface 211, the second side surface 212, the lead top surface 213 and the lead bottom surface 214 extends from the connecting end 215 toward the enlarged free end 216. The connecting ends 215 of the inner lead portions 21 are connected together.

The first side surface 211 of the inner lead portion 21 of one of the leads 20 cooperates with the second side surface 212 of the inner lead portion 21 of an adjacent one of the leads to define one of the first hole-defining wall 510 of a corresponding one of the first hole-defining wall groups 51 and the second hole-defining wall 520 of a corresponding one of the second hole-defining wall groups 52.

In this embodiment, the enlarged free end 216 of the inner lead portion 21 of each of the leads 2 has a width (w) which increases toward the die pad 1. The first and second through holes 501, 502, which are respectively defined by the first and second hole-defining walls 51, 52 that are defined by the inner lead portions 21 of the leads 20, are in spatial communication with each other. To be specific, the inner lead portions 21 cooperate with the die pad 1 to define the corresponding first and second hole-defining walls 51, 52.

Each of the leads 20 of the lead unit 2 further includes an outer lead portion 22 that extends from the connecting end 215 of the inner lead portion 21 and that has a third side surface 221 and a fourth side surface 222 opposite to the third side surface 221. The third side surface 221 is connected between the lead top surface 213 and the lead bottom surface 214. The fourth side surface 222 is connected between the top surface 213 and the lead bottom surface 214.

The outer lead portion 22 of each of the leads 20 has a first end 223 connected to the inner lead portion 21 and a second end 224 opposite to the first end 223. Each of the third side surface 221, the fourth side surface 222, the lead top surface 213 and the lead bottom surface 214 extends from the first end 223 toward the second end 224 distal to the die pad 1. The first ends 223 of the outer lead portions 22 are connected together.

The third side surface 221 of the outer lead portion 22 of the one of the leads 20 cooperates with the fourth side surface 222 of the outer lead portion 22 of the adjacent one of the leads 20 to define another one of the first hole-defining wall 510 of the corresponding one of the first hole-defining wall groups 51 and the second hole-defining wall 520 of the corresponding one of the second hole-defining wall groups 52.

Figure 8:
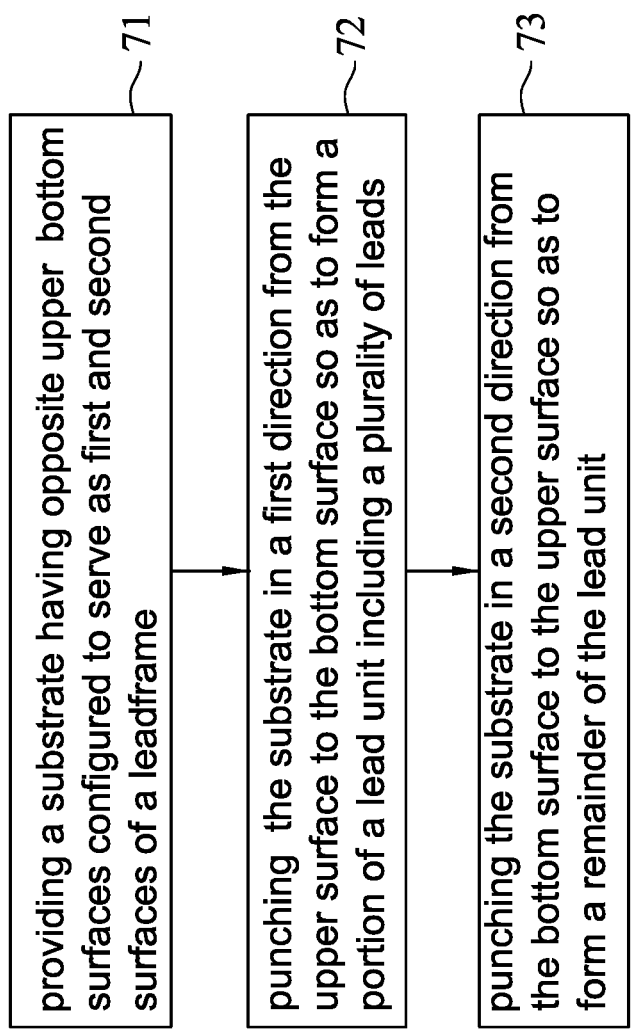
FIG. 8 is a flow chart illustrating consecutive steps of an embodiment of a method of making the leadframe of the disclosure.
Figure 9:
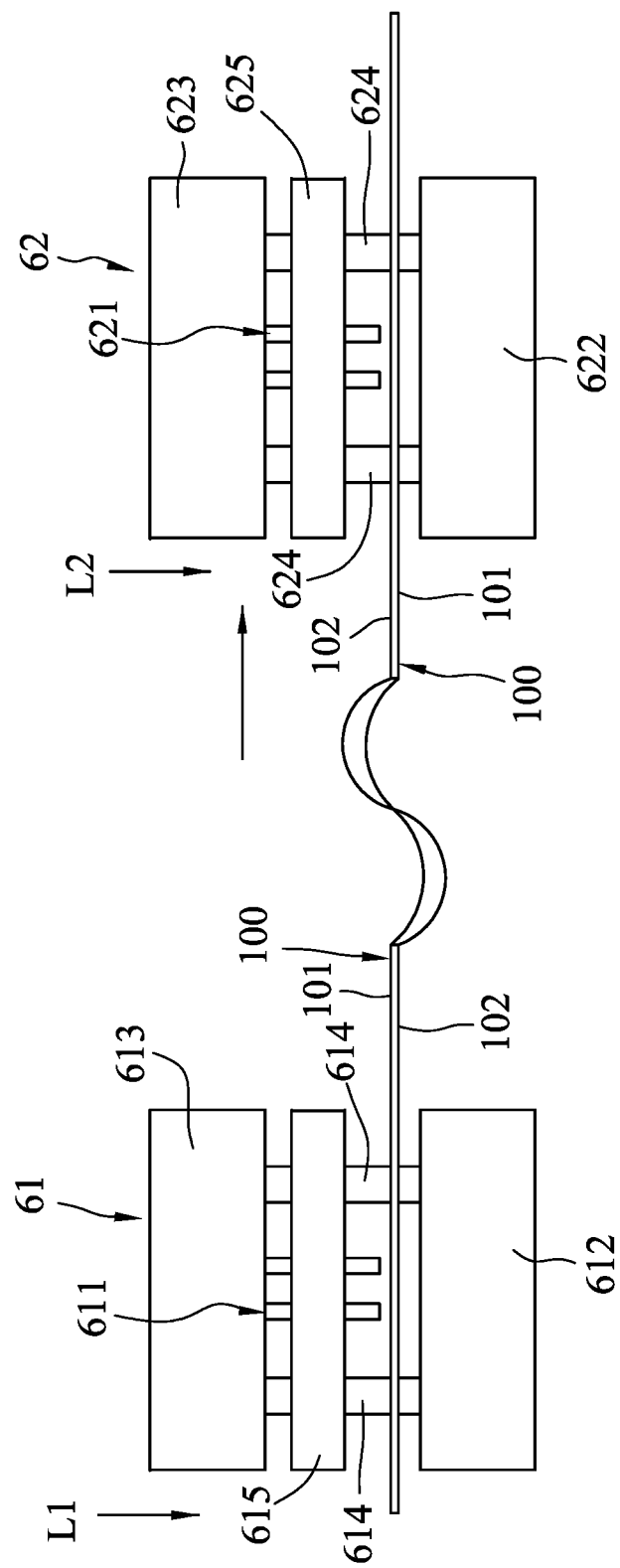
FIG. 9 is a schematic view illustrating the consecutive steps of the method of FIG. 8.

Referring to FIGS. 8 and 9, an embodiment of a method of making the embodiment of the leadframe according to the disclosure is illustrated. The method of the disclosure can be used in mass production of the leadframes 10, and in the following, making of one leadframe 10 is taken as an example for better understanding. In this embodiment, the method is exemplified to be carried out on a first punching machine 61 and a second punching machine 62. The first punching machine 61 includes a first upper mold 613, a first punch 611 connected to a bottom portion of the first upper mold 613, a first lower mold 612, two first guiding posts 614 connected between the first upper and lower molds 613, 612, and a first stripper plate 615 positioned between the first upper and lower molds 613, 612. The first punch 611 is drivable by the first upper mold 613 to move toward the first lower mold 612. The second punching machine 62 is disposed downstream of the first punching machine 61, and includes a second upper mold 623, a second punch 621 connected to a bottom portion of the second upper mold 623, a second lower mold 622, two second guiding posts 624 connected between the second upper and lower molds 623, 622, and a second stripper plate 625 positioned between the second upper and lower molds 623, 622. The second punch 621 is drivable by the second upper mold 623 to move toward the second lower mold 622. The structures of the first and second punching machines 61, 62 are not of the essence of the present disclosure, and therefore will not be further elaborated for the sake of brevity. The embodiment of the method of making the embodiment of the leadframe includes Step 71 to 73.

In Step 71, a substrate 100 having an upper surface 101 and a bottom surface 102 opposite to the upper surface 101 is provided. The upper and bottom surfaces 101, 102 of the substrate 100 are configured to serve as the first and second surfaces 3, 4 of the leadframe 10. The substrate 100 may be a metal sheet.

In step 72, the substrate 100 is punched in a first direction (L1) from the upper surface 101 to the bottom surface 102 so as to form a portion of a lead unit 2 including a plurality of the leads 20. To be specific, the punching of the substrate 100 in the first direction (L1) is conducted by passing the substrate 100 through the first punching machine 61 with the upper surface 101 facing the first punch 611 and punching the substrate 100 with the first punch 611 in the first direction (L1), such that a portion of the outer lead portion 22 and the inner lead portion 21 of the leads 20 and the first through holes 501 defined by the first hole-defining wall groups 51 are formed.

In step 73, the substrate 100 is punched in a second direction (L2) from the bottom surface 102 to the upper surface 101 so as to form a remainder of the lead unit 2. To be specific, the punching of the substrate 100 in the second direction (L2) is conducted by passing the substrate 100 through the second punching machine 62 with the bottom surface 102 facing the second punch 621 of the second punching machine 62 and punching the substrate 100 with the second punch 621 in the second direction (L2), such that a remainder of the outer lead portion 22 and the inner lead portion 21 of the leads 20 and the second through holes 502 defined by the second hole-defining wall groups 52 are formed.

Figure 5:
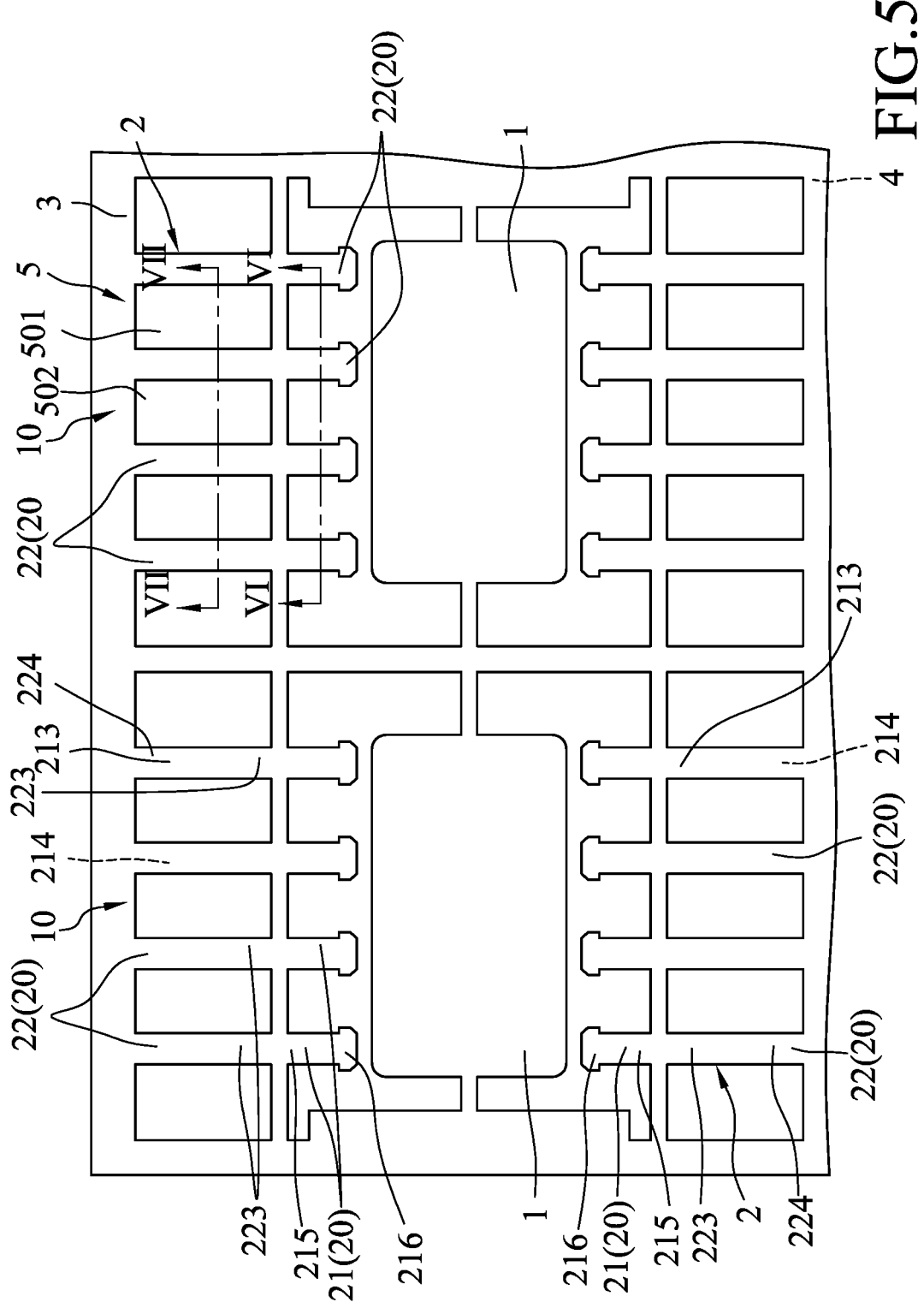
FIG. 5 is a partly enlarged view of FIG. 4.

In this embodiment, the die pad 1 (as shown in FIG. 5) is also formed during Steps 72 and 73, and the outer lead portion of each of the leads extends from the inner lead portion 21.

In one form, the first punching machine 61 and the second punching machine 62 are disposed side by side and the embodiment of the method further includes turning the bottom surface 102 of the substrate 100 to face the second punch 621 after the punching of the substrate 100 in the first direction (L1).

Figure 10:
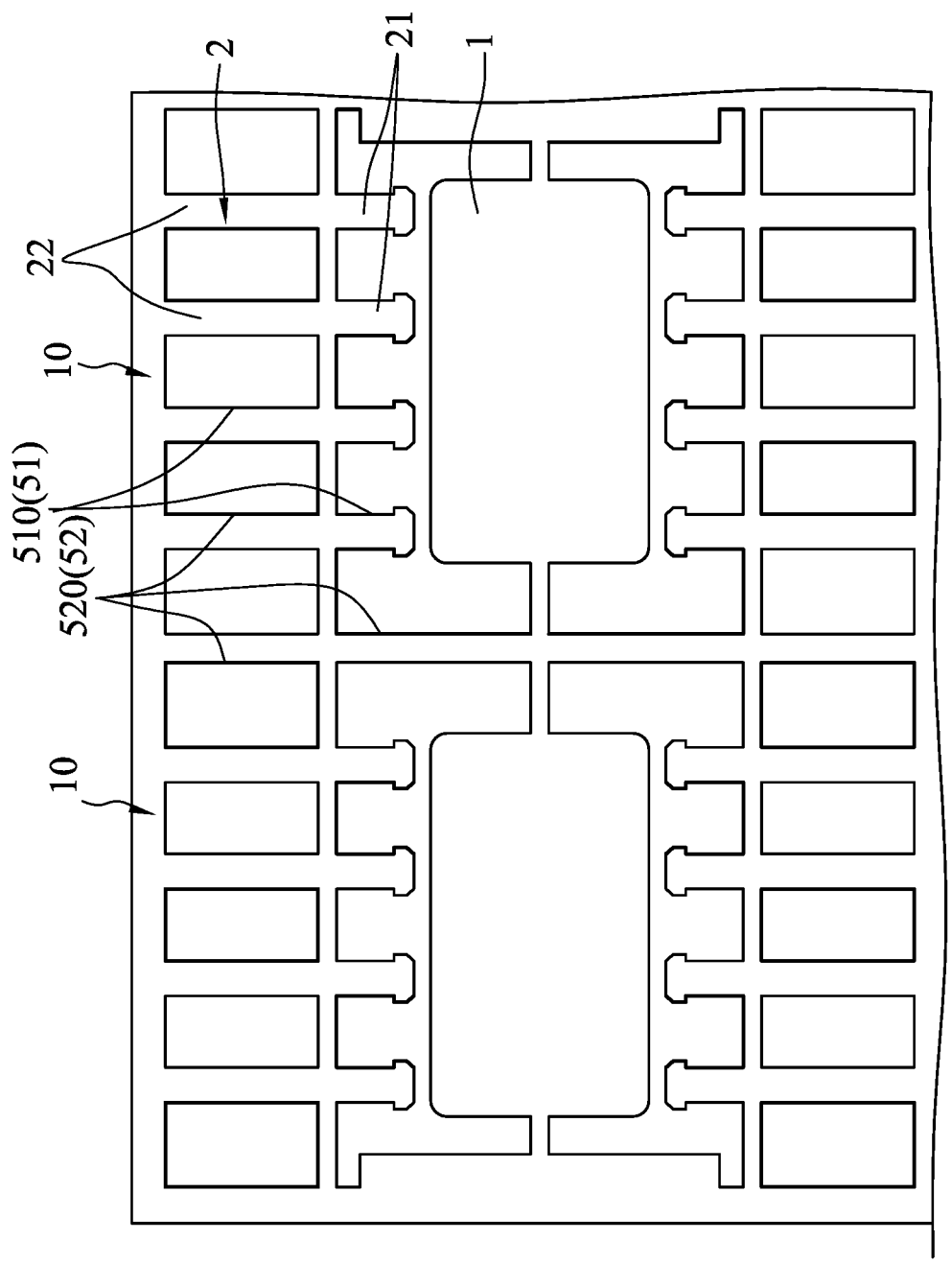
FIGS. 10 to 11 are top views respectively showing various configurations of the embodiment of the leadframe.

In one form, the punching of the substrate 100 in the first direction (L1), the turning of the bottom surface 102 of the substrate 100 to face the second punch 621, and the punching of the substrate 100 in the second direction (L2) are consecutively conducted. Referring to FIG. 10, the first hole-defining wall groups 51, which are formed by punching the substrate 100 in the first direction (L1) using the first punching machine 61, are depicted in thick lines. The second hole-defining wall groups 52, which are formed by punching the substrate 100 in the second direction (L2) using the second punching machine 62, are depicted in thin lines. The first through holes 501 and the second through holes 502 respectively defined by the first hole-defining wall groups 51 and the second hole-defining wall groups 52 are also clearly shown.

Figure 11:
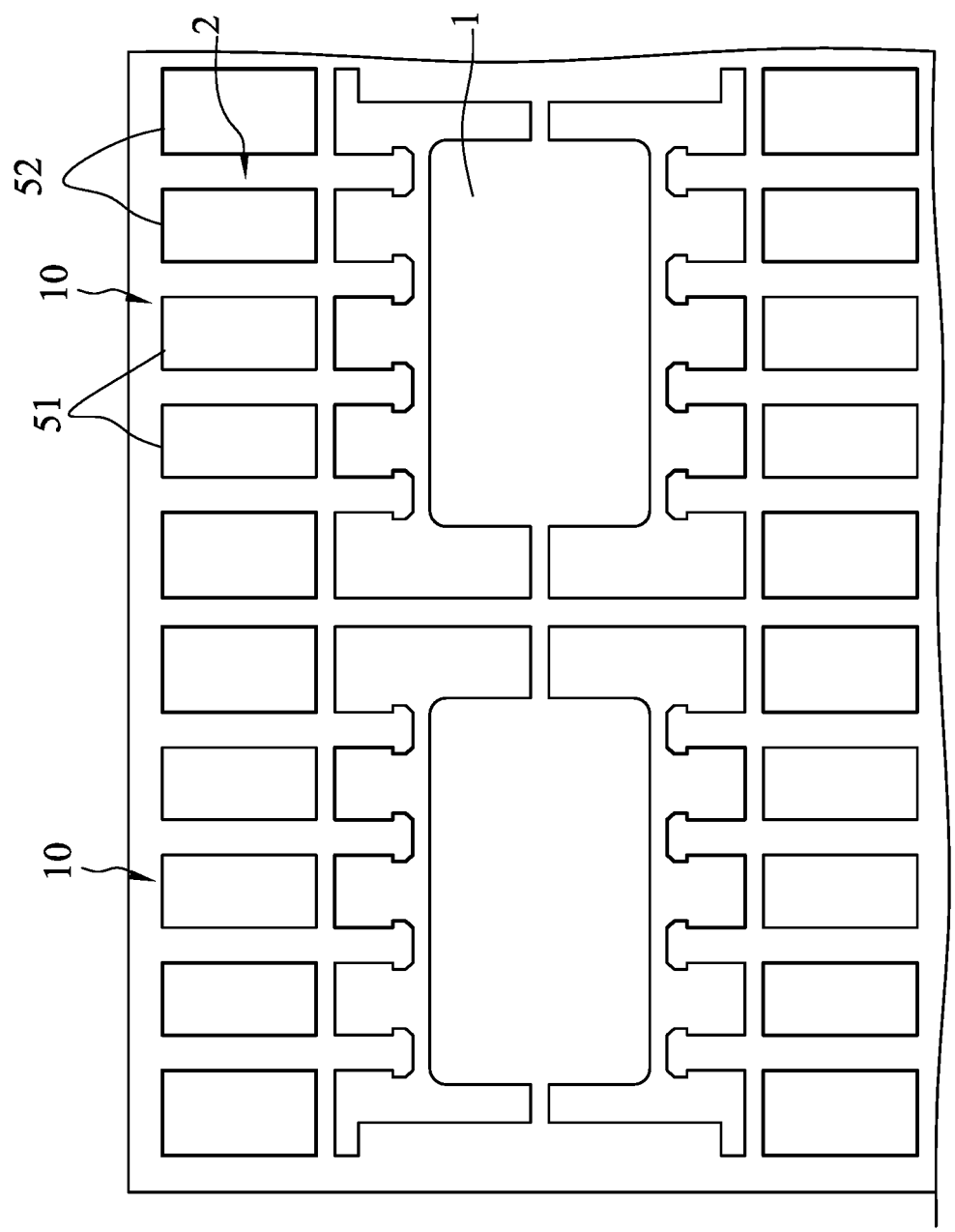

Referring to FIG. 11, another configuration of the embodiment of the leadframe 10 is illustrated. To be specific, each of the first hole-defining wall groups 51 includes two of the first hole-defining walls 510, and each of the second hole-defining wall groups 52 includes two of the second hole-defining wall groups 520. The first and second side surfaces 211, 212 of the inner lead portion 21 of one of the leads 20 respectively cooperate with the second side surface 212 of the inner lead portion 21 of an adjacent one of the leads 20 and the first side surface 211 of the inner lead portion 21 of another adjacent one of the leads 20 to define one of the first hole-defining walls 51 of a corresponding one of the first hole-defining wall groups 51 and the second hole-defining walls 52 of a corresponding one of the second hole-defining wall groups 52.

Furthermore, the third and fourth side surfaces 221, 222 of the outer lead portion 22 of the one of the leads 20 respectively cooperate with the fourth side surface 222 of the outer lead portion 22 of an adjacent one of the leads 20 and the third side surface 221 of the outer lead portion 22 of the another adjacent one of the leads 20 to define the other one of the first hole-defining walls 51 of the corresponding one of the first hole-defining wall groups 51 and the second hole-defining walls 520 of the corresponding one of the second hole-defining wall groups 52.

Figure 12:
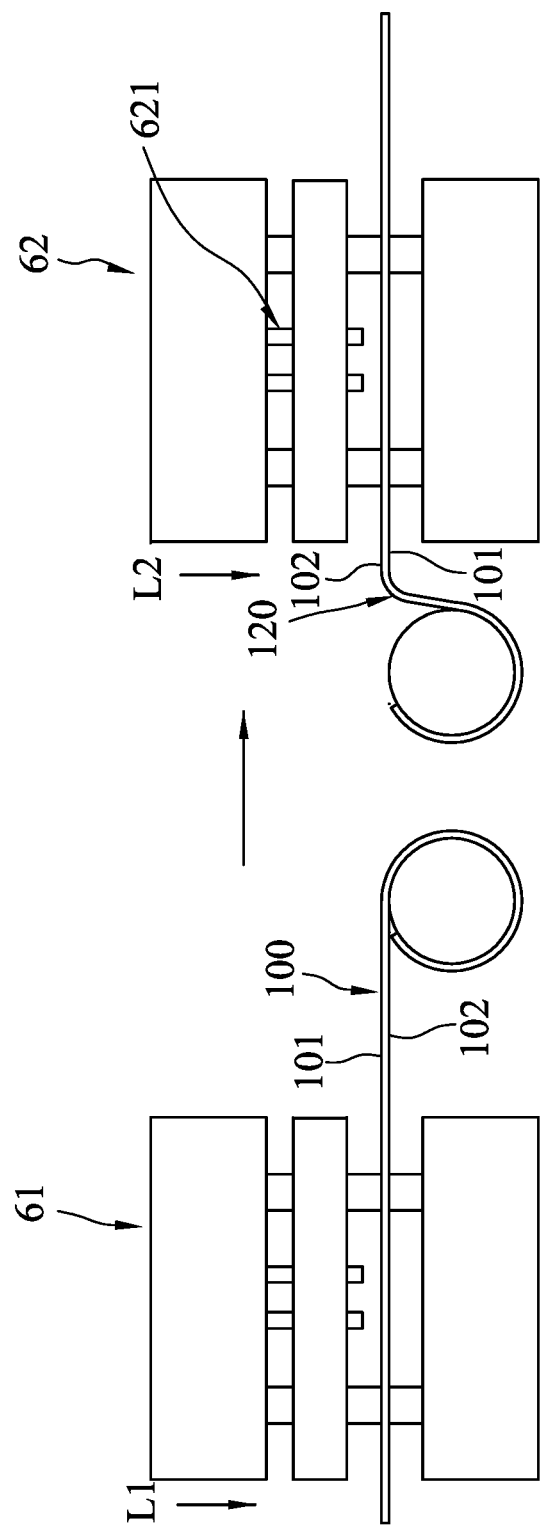
FIG. 12 is a schematic view illustrating consecutive steps of a modification of the embodiment of the method of making the leadframe.

Referring to FIG. 12 in combination with FIG. 8, in another form of the embodiment of the method of making the embodiment of the leadframe according to the disclosure, the turning of the bottom surface 102 of the substrate 100 includes: reeling up the substrate 100 after the punching of the substrate 100 in the first direction (L1); transporting the reeled substrate 120 to the second punching machine; and reeling off the reeled substrate 120 such that the bottom surface of the substrate 100 faces the second punch 621.

To sum up, by way of punching the substrate 100 in the first and second directions (L1, L2), respectively, in the leadframe 10 thus formed, the first through holes 501 and the second through holes 502 are alternately positioned and each of the first surface 3 and the second surface 4 cooperates with the first and second hole-defining walls 51, 52 to form the arcuate and burr regions. Hence, the stress received by the substrate 100 during punching will be evenly distributed instead of being accumulated. Undesired bending of the leadframe 10 thus formed can thereby be avoided.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A leadframe, comprising:
   a first surface;
   a second surface opposite to said first surface;
   a lead unit including a plurality of leads each having a lead top surface and a lead bottom surface opposite to said lead top surface, said lead top surfaces of said leads cooperatively defining said first surface, said lead bottom surfaces of said leads cooperatively defining said second surface; and
   a hole-defining wall unit including a plurality of first hole-defining wall groups each having at least one first hole-defining wall and a plurality of second hole-defining wall groups each having at least one second hole-defining wall, each of said first hole-defining walls extending from said first surface to said second surface and surroundingly defining a first through hole, each of said second hole-defining walls extending from said first surface to said second surface and surroundingly defining a second through hole,
   wherein said first and second hole-defining wall groups are alternately disposed in said lead unit, each of said first through holes defined by said first hole-defining walls of said first hole-defining wall groups and said second through holes defined by said second hole-defining walls of said second hole-defining wall groups being formed between two adjacent ones of said leads;
   wherein said at least one first hole-defining wall of each of said first hole-defining wall groups has a first top edge connected to said first surface and a first bottom edge opposite to said first top edge and connected to said second surface, said first top edge and said first surface cooperatively forming an arcuate region at a first junction therebetween, said first bottom edge and said second surface cooperatively forming a burr region at a second junction therebetween, said burr region protruding from said second surface; and
   wherein said at least one second hole-defining wall of each of said second hole-defining wall groups has a second top edge connected to said first surface and a second bottom edge opposite to said second top edge and connected to said second surface, said second top edge and said first surface cooperatively forming a burr region at a third junction therebetween, said burr region protruding from said first surface, said second bottom edge and said second surface cooperatively forming an arcuate region at a fourth junction therebetween.

2. The leadframe of claim 1, wherein each of said leads of said lead unit has an inner lead portion that has a first side surface connected between said lead top surface and said lead bottom surface, and a second side surface opposite to said first side surface and connected between said lead top surface and said lead bottom surface;
   wherein each of said inner lead portions of said leads has a connecting end and an enlarged free end opposite to said connecting end, each of said first side surface, said second side surface, said lead top surface and said lead bottom surface extending from said connecting end toward said enlarged free end, said connecting ends of said inner lead portions being connected together; and
   wherein said first side surface of said inner lead portion of one of said leads cooperates with said second side surface of said inner lead portion of an adjacent one of said leads to define one of said at least one first hole-defining wall of a corresponding one of said first hole-defining wall groups and said at least one second hole-defining wall of a corresponding one of said second hole-defining wall groups.

3. The leadframe of claim 2, wherein each of said leads of said lead unit further includes an outer lead portion that extends from said connecting end of said inner lead portion and that has a third side surface connected between said lead top surface and said lead bottom surface and a fourth side surface opposite to said third side surface and connected between said lead top surface and said lead bottom surface;
   wherein said outer lead portion of each of said leads has a first end connected to said inner lead portion and a second end opposite to said first end, each of said third side surface, said fourth side surface, said lead top surface and said lead bottom surface extending from said first end toward said second end, said first ends of said outer lead portions being connected together; and
   wherein said third side surface of said outer lead portion of said one of said leads cooperates with said fourth side surface of said outer lead portion of the adjacent one of said leads to define the other one of said at least one first hole-defining wall of the corresponding one of said first hole-defining wall groups and said at least one second hole-defining wall of the corresponding one of said second hole-defining wall groups.

4. The leadframe of claim 1, wherein each of said first hole-defining wall groups includes two of said first hole-defining walls, each of said second hole-defining wall groups including two of said second hole-defining walls;
   wherein each of said leads of said lead unit has a first side surface connected between said lead top surface and said lead bottom surface, and a second side surface opposite to said first side surface and connected between said lead top surface and said lead bottom surface;

wherein each of said inner lead portions of said leads has a connecting end and an enlarged free end opposite to said connecting end, each of said first side surface, said lead top surface, said lead bottom surface and said second side surface extending from said first end toward said enlarged free end, said connecting ends of said inner lead portions being connected together; and wherein said first and second side surfaces of said inner lead portion of one of said leads respectively cooperate with said second side surface of said inner lead portion of an adjacent one of said leads and said first side surface of said inner lead portion of another adjacent one of said leads to define one of said first hole-defining walls of a corresponding one of said first hole-defining wall groups and said second hole-defining walls of a corresponding one of said second hole-defining wall groups.

5. The leadframe of claim 4, wherein each of said leads of said lead unit further includes an outer lead portion that extends from said connecting end of said inner lead portion and that has a third side surface connected between said lead top surface and said lead bottom surface and a fourth side surface opposite to said third side surface and connected between said lead top surface and said lead bottom surface;

wherein said outer lead portion of each of said leads has a first end connected to said inner lead portion and a second end opposite to said first end, said first ends of said outer lead portions being connected together; and wherein said third and fourth side surfaces of said outer lead portion of said one of said leads respectively cooperate with said fourth side surface of said outer lead portion of an adjacent one of said leads and said third side surface of said outer lead portion of said another adjacent one of said leads to define the other one of said first hole-defining walls of said corresponding one of said first hole-defining wall groups and said second hole-defining walls of said corresponding one of said second hole-defining wall groups.

6. The leadframe of claim 5, wherein said first and second through holes, which are respectively defined by said first and second hole-defining walls defined by said inner lead portions of said leads, are in spatial communication with each other.

7. A method of making a leadframe, comprising:

providing a substrate having an upper surface and a bottom surface opposite to the upper surface, the upper and bottom surfaces of the substrate being configured to serve as first and second surfaces of said leadframe;

punching the substrate in a first direction from the upper surface to the bottom surface so as to form a portion of a lead unit including a plurality of leads; and punching the substrate in a second direction from the bottom surface to the upper surface so as to form a remainder of the lead unit, wherein the punching of the substrate in the first direction is conducted by passing the substrate through a first punching machine with the upper surface facing a first punch of the first punching machine and punching the substrate with the first punch, the punching of the substrate in the second direction being conducted by passing the substrate through a second punching machine with the bottom surface facing a second punch of the second punching machine and punching the substrate with the second punch, the method further comprising turning the bottom surface of the substrate to face the second punch after the punching of the substrate in the first direction.

8. The method of claim 7, wherein the punching of the substrate in the first direction, the turning of the bottom surface of the substrate to face the second punch, and the punching of the substrate in the second direction are consecutively conducted.

9. The method of claim 7, wherein the turning of the bottom surface of the substrate comprising reeling up the substrate after the punching of the substrate in the first direction, transporting the reeled substrate to the second punching machine, and reeling off the reeled substrate.

10. The method of claim 7, wherein the punching of the substrate in the first direction and the punching of the substrate in the second direction are conducted to form a plurality of first and second through holes juxtaposed with each other in the substrate.

11. The method of claim 7, wherein each of the leads of the lead unit has an inner lead portion and an outer lead portion extending from said inner lead portion, the punching of the substrate in the first direction being conducted to form a portion of the inner and outer lead portions, and the punching of the substrate in the second direction being conducted to form a remainder of the inner and outer lead portions.

12. A method of making a leadframe, comprising:

providing a substrate having an upper surface and a bottom surface opposite to the upper surface, the upper and bottom surfaces of the substrate being configured to serve as first and second surfaces of said leadframe;

punching the substrate in a first direction from the upper surface to the bottom surface so as to form a portion of a lead unit including a plurality of leads; and punching the substrate in a second direction from the bottom surface to the upper surface so as to form a remainder of the lead unit, wherein the punching of the substrate in the first direction and the punching of the substrate in the second direction are conducted to form a plurality of first and second through holes juxtaposed with each other in the substrate.

13. The method of claim 12, wherein the punching of the substrate in the first direction is conducted by passing the substrate through a first punching machine with the upper surface facing a first punch of the first punching machine and punching the substrate with the first punch, the punching of the substrate in the second direction being conducted by passing the substrate through a second punching machine with the bottom surface facing a second punch of the second punching machine and punching the substrate with the second punch, the method further comprising turning the bottom surface of the substrate to face the second punch after the punching of the substrate in the first direction.

14. The method of claim 13, wherein the punching of the substrate in the first direction, the turning of the bottom surface of the substrate to face the second punch, and the punching of the substrate in the second direction are consecutively conducted.

15. The method of claim 13, wherein the turning of the bottom surface of the substrate comprising reeling up the substrate after the punching of the substrate in the first direction, transporting the reeled substrate to the second punching machine, and reeling off the reeled substrate.

16. The method of claim 12, wherein each of the leads of the lead unit has an inner lead portion and an outer lead portion extending from said inner lead portion, the punching of the substrate in the first direction being conducted to form a portion of the inner and outer lead portions, and the punching of the substrate in the second direction being conducted to form a remainder of the inner and outer lead portions.

\* \* \* \* \*